US008641929B2

(12) United States Patent
Endoh et al.

(10) Patent No.: US 8,641,929 B2
(45) Date of Patent: Feb. 4, 2014

(54) LOW-TEMPERATURE-SINTERABLE BONDING MATERIAL, AND BONDING METHOD USING THE BONDING MATERIAL

(75) Inventors: Keiichi Endoh, Okayama (JP); Yutaka Hisaeda, Okayama (JP); Akihiro Miyazawa, Okayama (JP); Aiko Nagahara, Okayama (JP); Toshihiko Ueyama, Okayama (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 0 days.

(21) Appl. No.: 13/702,718

(22) PCT Filed: Jun. 10, 2011

(86) PCT No.: PCT/JP2011/063418
§ 371 (c)(1),
(2), (4) Date: Dec. 7, 2012

(87) PCT Pub. No.: WO2011/155615
PCT Pub. Date: Dec. 15, 2011

(65) Prior Publication Data
US 2013/0081759 A1 Apr. 4, 2013

(30) Foreign Application Priority Data
Jun. 11, 2010 (WO) .................. PCT/JP2010/059921

(51) Int. Cl.
*H01B 1/02* (2006.01)
*B41J 2/16* (2006.01)
*C04B 28/36* (2006.01)

(52) U.S. Cl.
USPC ...................... 252/514; 156/326; 106/287.23

(58) Field of Classification Search
USPC ............ 252/500–521.6; 156/326; 106/287.23
See application file for complete search history.

(56) References Cited

U.S. PATENT DOCUMENTS

| 7,422,707 B2 * | 9/2008 | Zhuo ............................ 252/500 |
| 2006/0199008 A1 | 9/2006 | Sato |

(Continued)

FOREIGN PATENT DOCUMENTS

| JP | 2006-241494 | 9/2006 |
| JP | 2007-42301 | 2/2007 |

(Continued)

OTHER PUBLICATIONS

Morita et al., "Development of Lead-Free Bonding Technique for High Temperature Environment Using Micrometer-Sized Silver Oxide Particles", Materia Japan, vol. 49, No. 1, 2010.

(Continued)

*Primary Examiner* — Mark Kopec
*Assistant Examiner* — Jaison Thomas
(74) *Attorney, Agent, or Firm* — Greenblum & Bernstein, P.L.C.

(57) ABSTRACT

Provided is a bonding material which enables formation of a bonded article in nitrogen, and can exhibit bonding strength to withstand practical use while having reduced bonding fluctuations between samples without a heat treatment procedure under pressurized or high temperature conditions. The bonding material comprises: silver nanoparticles having an average primary particle diameter of 1 to 200 nm and coated with an organic substance having 8 carbon atoms or less; a dispersion medium having a boiling point of 230° C. or higher; and a flux component including an organic matter having at least two carboxyl groups. Particularly, it is preferable to use the silver nanoparticles and submicron silver particles in combination.

8 Claims, 2 Drawing Sheets

(56) References Cited

U.S. PATENT DOCUMENTS

| | | | |
|---|---|---|---|
| 2007/0098883 A1* | 5/2007 | Itoh et al. | 427/180 |
| 2008/0272344 A1* | 11/2008 | Jiang et al. | 252/513 |
| 2009/0001568 A1* | 1/2009 | Mancera et al. | 257/737 |
| 2009/0321689 A1 | 12/2009 | Harada et al. | |
| 2010/0113647 A1 | 5/2010 | Harada et al. | |
| 2010/0224837 A1* | 9/2010 | Wu et al. | 252/514 |
| 2011/0042447 A1 | 2/2011 | Komatsu | |
| 2012/0103515 A1 | 5/2012 | Endoh et al. | |
| 2012/0298009 A1 | 11/2012 | Endoh et al. | |

FOREIGN PATENT DOCUMENTS

| | | |
|---|---|---|
| JP | 2007-95525 | 4/2007 |
| JP | 2009-7593 | 1/2009 |
| JP | 2009-267374 | 11/2009 |
| JP | 2009-279649 | 12/2009 |
| JP | 2010-80438 | 4/2010 |
| JP | 2011-240406 | 12/2011 |
| WO | 2005/025787 | 3/2005 |
| WO | 2009/116185 | 9/2009 |
| WO | 2010/018782 | 2/2010 |

OTHER PUBLICATIONS

Search Report for International Application No. PCT/JP2011/063418, mail date is Aug. 30, 2011.

Office Action for JP Application No. 2012-519443, mailed on Nov. 5, 2013.

* cited by examiner

LOW-TEMPERATURE-SINTERABLE BONDING MATERIAL, AND BONDING METHOD USING THE BONDING MATERIAL

TECHNICAL FIELD

The present invention relates to a bonding material and a bonding method using the same.

BACKGROUND ART

Due to high-current electronic components used for cars or industrial instruments, the operating temperature of semiconductors used therein tends to be higher. Accordingly, there has been a need for a bonding material which can withstand such a high-temperature environment. A lead-containing solder which retains its strength at a high temperature has been conventionally used, but it has been a need for a bonding method which is adapted to such a condition since use of lead tends to be restricted these days.

As a potential bonding method which can withstand such a requirement without using lead, a bonding method with silver nanoparticles has attracted attention these days, which enables bonding under a lower temperature condition than in the case of a bulk state of silver. In such tendency, for example, the method for mixing silver oxide particles and myristyl alcohol to make a bonding material (Non Patent Literature 1 and Patent Literature 1), the method for adding carboxylic acid to a mixture of silver carbonate or silver oxide and silver nanoparticles to make a bonding material (Patent Literature 2), and the silver nanoparticle coated with an alkoxide derived from alcohol, which has been shown to be utilized as a bonding material (Patent Literature 3) have been proposed.

CITATION LIST

Patent Literature

Patent Literature 1: Japanese Patent Application Laid-Open No. 2009-267374
Patent Literature 2: Japanese Patent Application Laid-Open No. 2009-279649
Patent Literature 3: International Publication No. WO 2009/116185 pamphlet

Non Patent Literature

Non Patent Literature 1: Morita et al. "Development of Lead-Free Bonding Technique for High Temperature Environment Using Micrometer-Sized Silver Oxide Particles", Materia Japan, Volume 49, No. 1 (2010)

SUMMARY OF THE INVENTION

Problems to be Solved by the Invention

As described in the technique described in Non Patent Literature 1 and others, not a little pressurization from an upper part and the like in bonding have been generally required in such a bonding method utilizing silver. In order to apply such a technique, a device which can performs at least pressurization and heating simultaneously has been required, thereby leading to some difficulty for general-purpose. Also, there has been a problem that such a technique cannot be used for a material which has only mechanical strength insufficient to withstand pressurization. Therefore, it has been expected that the target for use will be significantly expanded if a paste exhibiting adequate bonding strength can be provided without pressurization.

Since a bonded article is formed generally in an oxidative atmosphere containing oxygen such as in the air, it has been concerned that silver in the interface, which may have an adverse effect on the bonding strength, can be oxidized to silver oxide. Particularly, in a fine bonded article, such influence is supposed to be remarkable in respect of the bonding strength or others. As for a bonding target, an inflammable member may be present in the vicinity of a bonding portion, and thus bonding may have to be actively carried out in an environment free from oxygen.

Therefore, it has been expected that the field of application and possibility of such a paste can be significantly expanded if the bonding material can be provided which exhibits bonding strength sufficient in an inert atmosphere such as nitrogen that can eliminate such influence. In the application which requires stability and reliability of the quality, fluctuations in bonding strength between samples (products) have been also needed to be reduced.

The technique described in Patent Literature 3 has enabled formation of the bonded article but has had a problem of preservation stability. Briefly, as in the paragraph [0077] of Patent Literature 3, aggregation of particles has been caused when a solvent is not added just before use, which has showed difficulty in providing a paste form having metal (silver) nanoparticles and a solvent incorporated, thereby resulting in low practical use.

It is an object of the present invention to provide a bonding material which enables formation of a bonded article in an inert gas such as nitrogen, exhibits bonding strength to withstand practical use while having reduced bonding fluctuations between samples without a heat treatment procedure under pressurized or high temperature conditions, and can be preserved with a solvent and particles being mixed.

Means for Solving the Problem

As a result of intensive studies to solve the above-mentioned problems, the present inventors arrived at the present invention upon finding that, with a bonding material described below, a bonded article exhibits strength to withstand practical use while having reduced bonding fluctuations even when formed under the above-mentioned environment.

More specifically, the bonding material of the present invention includes silver nanoparticles having an average primary particle diameter of 1 to 200 nm and coated with an organic substance and having 8 carbon atoms or less, and a dispersion medium having a boiling point of 230° C. or higher.

In addition, the bonding material of the present invention may further contain submicron silver particles having an average particle diameter of 0.5 to 3.0 μm.

The dispersion medium in which the boiling point of a liquid used for a solvent is 230° C. or higher is preferably octanediol.

Furthermore, the bonding material appropriately contains an organic matter having at least two carboxyl groups as a flux component.

In addition, it is recommended that the organic matter having at least two carboxyl groups further have an ether bond and more preferably the organic matter be oxydi(acetic acid) (diglycolic acid).

Moreover, at least one of the organic matters which coat the surface of silver nanoparticles preferably has 6 carbon atoms.

In the present invention, a bonding method using the above bonding material is provided. Specifically, a method for bonding two different substances, comprising the steps of: applying to a bonding surface a bonding material including silver nanoparticles having at least an average primary particle diameter of 1 to 200 nm and coated with an organic substance having 8 carbon atoms or less, an organic matter having at least two carboxyl groups and at least one ether bond as a flux component, and a dispersion medium having a boiling point of 230° C. or higher (applying step); placing an object to be bonded on the bonding material; pre-firing for heating to a predetermined temperature with the object to be bonded being placed; and main-firing for heating to a temperature higher than the temperature of the pre-firing.

In the bonding method of the present invention, the steps of the pre-firing and the main-firing can be carried out under an inert gas atmosphere.

In the bonding method of the present invention, the step of the main-firing can be carried out at a temperature of 200° C. or higher and 500° C. or lower.

Advantageous Effects of the Invention

Use of the above-mentioned bonding material provides the bonded article which has high bonding strength and reduced fluctuations in bonding strength between samples even when heated in an inert atmosphere.

BEST MODE FOR CARRYING OUT THE INVENTION

The bonding material of the present invention includes silver nanoparticles and a dispersion medium. Preferably, the bonding material of the present invention may further include silver particles having a size of submicron order (referred to as submicron silver particles) and the like. Such a bonding material of the present invention is in a paste form. The constituents of the bonding material of the present invention will be described below in detail. The bonding material of the present invention may also be referred to simply as a "paste."

<Silver Nanoparticles>

The silver nanoparticles used in the present invention have an average primary particle diameter of 200 nm or smaller, preferably 1 to 150 nm, more preferably 10 to 100 nm as is calculated from a transmission electron microscope (TEM) photograph. Use of the silver nanoparticles having such a particle diameter enables formation of the bonded article having strong bonding strength.

The evaluation of the average primary particle diameter was carried out through a transmission electron microscope according to the following procedure. First, 2 parts by mass of the silver nanoparticles after washed were added to a mixed solution containing 96 parts by mass of cyclohexane and 2 parts by mass of oleic acid, and dispersed by sonication to obtain a dispersed liquid. Next, the dispersed solution was added dropwise to a Cu microgrid equipped with a supporting film and dried to obtain a TEM sample. An image of particles of the produced TEM sample was photographed with the transmission electron microscope (JEM-100CXMark-II model, produced by JEOL Ltd.) in bright field at an acceleration voltage of 100 kV and a magnification of 300,000.

The average primary particle diameter of particles can be determined by directly measuring with calipers or the like from the photograph obtained by the above method, and also can be calculated with an image software. The average primary particle diameter at this time was calculated with the number average obtained by measuring at least 200 independent particles in the TEM photograph.

The silver nanoparticles used in the present invention have the above particle diameter while having the surface thereof coated with an organic matter. The organic matter having 8 carbon atoms or less in total can be preferably used. In particular, the organic matter having 8 carbon atoms or less and at least one carboxyl group can be preferably used. Specifically, the following substances can be illustrated, but are not limited to only these substances. Examples of the substances may include saturated fatty acids such as octanoic acid (caprylic acid), heptanoic acid (enanthic acid), hexanoic acid (caproic acid), pentanoic acid (valeric acid), butanoic acid (butyric acid), and propanoic acid (propionic acid). Further, exemplary substances may include dicarboxylic acids such as oxalic acid, malonic acid, methylmalonic acid, ethylmalonic acid, succinic acid, methylsuccinic acid, ethylsuccinic acid, phenylsuccinic acid, glutaric acid, adipic acid, pimelic acid, and suberic acid. Exemplary substances may include unsaturated fatty acids such as sorbic acid and maleic acid.

Coating of the surface of particles with these organic matters allows the silver nanoparticles to be prevented from being dissolved in a solvent (dispersion medium) and thereby to be present in the solvent in a stable state. Having such characteristics eliminates a factor which has affected the preservation stability of a paste to provide a stable paste without adding the solvent just before use as described in Patent Literature 3. "The stable state of the silver nanoparticles in the solvent" used here refers to the state in which solvent separation and others are not caused even in the mixed state of the silver nanoparticle and the solvent, and degree of variability of the solvent viscosity is controlled within 20% in comparison between just after preparation and after allowing to stand at a normal temperature for 90 days, thereby keeping an usable state.

When the surface of the silver nanoparticles is coated particularly with hexanoic acid, heptanoic acid, adipic acid, sorbic acid, or malonic acid among the above, the silver nanoparticles can be manufactured easily and obtained in a powder form. That is, the silver nanoparticles having the surface thereof coated with such substances are aggregated and can be recovered easily while maintaining the form of primary particles. When the drying procedure at a low temperature (lower than 100° C.) optionally under a vacuum atmosphere is added, the silver nanoparticles can be recovered as dry particles. The size of an aggregate obtained at this time may be 2.5 µm or larger since the aggregate can be recovered with is at least a 5C filter paper according to JISP-3801.

This does not mean that the $D_{50}$ of the aggregate is 2.5 µm or larger in terms of the size of the aggregate. The reason is that, if it is the $D_{50}$ value, more aggregates are not filtered out and pass through the filter paper, thereby leading to lower recovery efficiency. However, it was confirmed that a clear filtrate was obtained without being suspended since the silver nanoparticles according to the present invention did not include particles having a size of 2.5 µm or smaller. Specifically, it may be understood that the silver nanoparticles coated with hexanoic acid, heptanoic acid, adipic acid, sorbic acid, or malonic acid result in an aggregate having not an average value but a size of at least about 2.5 µm. Therefore, the silver nanoparticles coated with a molecule having a size of this order are preferably used to be designed as a bonding material. Then, by preparing these particles under suitable conditions, for example, as described herein in Example, even the particles in the form of an aggregate when recovered can be dissociated from one another to provide the bonding material which can be applied by printing with a dispenser, etc.

Further, it is possible to use the silver nanoparticles coated with a plurality of organic matters, or also to use the is silver nanoparticles having different average primary particle diameters in combination.

<Submicron Silver Particles>

Addition of the submicron silver particles of submicron order besides the above silver nanoparticles can further contribute to improvement in bonding strength. Specifically, the submicron silver particles having an average particle diameter of 0.5 µm or more are preferably used. The average particle diameter herein was calculated on the basis of laser diffractometry according to the following procedure. First, 0.3 g of a sample of the submicron silver particles was put into 50 mL of isopropyl alcohol and dispersed for 5 minutes with an ultrasonic cleaning machine at an output of 50 W. Thereafter, the value of $D_{50}$ (particle diameter of cumulative 50% by mass of the particles) was measured with a Microtrac particle diameter distribution analyzer (9320-X100, produced by Honeywell-Nikkiso Co., Ltd.) based on laser diffractometry to give an average particle diameter. The submicron silver particles having an average particle diameter at this time in to the range of 0.5 to 3.0 µm, preferably 0.5 to 2.5 µm, and more preferably 0.5 to 2.5 µm are used in combination with the silver nanoparticles to provide the bonded article having high bonding strength.

At this time, it is recommended that the ratio of the metal components including the silver nanoparticles and the submicron silver particles to all components constituting the bonding material be at least 80% by mass or more, and more preferably 85% by mass or more. This range of the metal content is preferred since the bonding strength of the bonding material can be ensured when metalized. The upper limit of the metal content is 95% by mass. The metal content exceeding the upper limit is not preferred since the bonding strength is ensured but the strength fluctuations tend to be easily caused.

<Dispersion Medium>

The silver nanoparticles are dispersed in the dispersion medium in the bonding material having a paste state according to the present invention. It is preferable that the dispersion medium used at this time particularly have a boiling point of 230° C. or higher, and preferably 235° C. or higher, which is not evaporated easily. Use of the solvent having such a range of boiling point causes the solvent to be volatilized in the stage prior to the main-firing and can reduce fluctuations in contact state between a material to be bonded and the paste in a bonding part. As a result, strength fluctuations in the bonding part can be preferably reduced.

Furthermore, when the solvent is an organic solvent, it is recommended that the flash point thereof be 100° C. or higher, preferably 150° C. or higher, and more preferably 200° C. or higher. A too low flash point is not preferable since the solvent itself is volatilized easily. With the above range of flash point, the paste ensuring safety and being suitable for handling can be attained.

The solvent having the above-mentioned characteristics preferably has polarity. It was found that particularly with a substance having two or more hydroxyl groups, especially a diol having two hydroxyl groups, particularly a diol having 8 carbon atoms or less, suitable bonding strength and reduced strength fluctuations could be satisfied simultaneously.

<Flux Component>

Besides the above components, the organic matter may be added as a flux component to the bonding material according to the present invention. Specifically, it is recommended that dicarboxylic acid having at least two carboxyl groups, more preferably dicarboxylic acid having an ether bond and at least to two carboxyl groups be selected. By selecting and adding the substance having such a structure, the silver nanoparticle coated with the organic matter can be converted into a bulk state of silver even with a heat treatment at a relatively low temperature in nitrogen.

The above flux component is preferably decomposed into a simplest possible structure (specifically, the final form is carbon dioxide or water, etc.). Therefore, it is recommended that the flux component be preferably constituted only of elements such as carbon, hydrogen, and oxygen among organic matters. Also, the decomposition temperature is preferably at least a preset temperature of the heat treatment or less. The molecular weight of 1000 or smaller, preferably 500 or smaller, more preferably 300 or smaller causes decomposition or volatilization more easily, which is convenient for handling.

As the above flux component, glycolic acid having a dicarboxylic acid structure can be illustrated. A too large molecule is not preferred since a high temperature is required when decomposed. This is because it is desirable from a viewpoint of improvement in bonding strength that the flux component be decomposed and vaporized after the bonding part is formed, and do not remain in the bonding portion. The decomposition temperature is desirably at least below the preset temperature of the main-firing. Specifically, it is recommended that those having a decomposition temperature of 500° C. or lower, preferably 300° C. or lower be selected. However, in the case of those having a characteristic of being not decomposed but vaporized directly, the above "decomposition temperature" refers to the "evaporation (vaporization) temperature."

More specifically, it is recommended that the molecule have at most 15 carbon atoms or less, preferably 10 carbon atoms or less in total in the structure. Any structure having carbon atoms of this order can be decomposed and vaporized even at a relatively low temperature such as a bonding temperature.

<Dispersant>

A dispersant which disperses the silver nanoparticle powder properly may be added to the paste according to the present invention. Use of such a dispersant can ensure independency of the particles in the paste and provide the paste having excellent preservation stability. However, it must be careful that dispersibility may rather worsen depending on the substance to be added. As long as the dispersant has affinity to both the surface of the silver nanoparticles and the dispersion medium as its characteristics, even commercially available ones for general purpose are sufficient. Further, not only a single kind of dispersant but also combination thereof may be used. This amount of addition is 10% by mass or less, preferably 5% by mass or less, and more preferably 3% by mass or less with respect to the entire paste.

Representative dispersants having such characteristics may include low-molecular negative ion (anionic) compounds such as fatty acid salts (soaps), α-sulfo fatty acid ester salts (MES), alkylbenzene sulfonates (ABS), linear alkylbenzene sulfonates (LAS), alkyl sulfates (AS), alkyl ether sulfuric ester salts (AES), and alkyl sulfuric acid triethanols; low-molecular nonionic compounds such as fatty acid ethanolamides, polyoxyethylene alkyl ethers (AE), polyoxyethylene alkyl phenyl ethers (APE), sorbitols, and sorbitans; low-molecular positive ion (cationic) compounds such as alkyl trimethyl ammonium salts, dialkyl dimethyl ammonium chlorides, and alkyl pyridinium chlorides; low-molecular amphoteric compounds such as alkyl carboxyl betaines, sulfobetaines, and lecithins; high-molecular water based dispersants represented by naphthalene sulfonate formalin condensates, polystyrene sulfonates, polyacrylates, salts of copolymers of vinyl compounds and carboxylic acid-based monomers, carboxymethyl celluloses, polyvinyl alcohols, etc.; high-molecular non-water based dispersants such as partial alkyl esters of polyacrylic acid and polyalkylene polyamines; and high-molecular cationic dispersants such as polyethyleneimines and amino alkyl methacrylate copolymers. However, any dispersant having a structure other than those forms as illustrated herein is not excluded as long as it is preferably applied to the silver nanoparticles according to the present invention.

Specific names of the known dispersant are listed below, but use of the dispersant other than those described in this section is not excluded when it has the above-mentioned characteristics. Examples of such dispersants may include BEAULIGHT LCA-H, LCA-25NH, etc. produced by Sanyo Chemical Industries, Ltd., FLOWLEN DOPA-15B, etc. produced by KYOEISHA CHEMICAL Co., Ltd., SOLPLUS AX5, SOLSPERSE 9000, SOLTHIX 250, etc. produced by The Lubrizol Corporation, EFKA4008, etc. produced by EFKA Additives B.V., AJISPER PA111, etc. produced by Ajinomoto Fine-Techno Co., Inc., TEXAPHOR-UV21, etc., produced by Cognis Japan, Disper BYK2020, BYK220S, etc. produced by BYK Japan KK, DISPARLON 1751N, HIPLAAD ED-152, etc. produced by Kusumoto Chemicals, Ltd., FTX-207S, FTERGENT 212P, etc. produced by NEOS COMPANY LIMITED, AS-1100, etc. produced by Toagosei Co., Ltd., KAOCER 2000, KDH-154, MX-2045L, HOMOGENOL L-18, RHEODOL SP-010V, etc. produced by Kao Corporation, EPAN U103, SHALLOL DC902B, NOIGEN EA-167, PLYSURF A219B, etc. produced by Dai-Ichi Kogyo Seiyaku Co., Ltd., MEGAFAC F-477 etc. produced by DIC corporation, SILFACE SAG503A, DYNOL 604, etc., produced by Nissin Chemical Co., Ltd., SN SPERSE 2180, SN LEVELER S-906, etc. produced by SAN NOPCO LIMITED, and S-386 etc. produced by AGC SEIMI CHEMICAL Co., Ltd.

In the bonding material thus formed, the viscosity thereof can be properly changed with the kind of solvent or adjustment of the metal ratio. If the viscosity is adjustable, a printing method can be properly selected, which is supposed to contribute to expansion of the application to be utilized. It is because application to the bonding target part becomes easier. According to studies of the present inventers, the viscosity at a normal temperature is about 10 to 250 Pa·s, preferably about 10 to 100 Pa·s, and more preferably about 10 to 50 Pa·s. This value of the viscosity is the value at C (Cone) of 35/2 and 5 rpm under the condition of 25° C.

<Manufacture of Bonding Material (Paste)>

The bonding material according to the present invention is provided roughly through the following manufacturing method. For example, the silver nanoparticles as described in Japanese Patent No. 4344001 can be used as silver nanoparticles. The silver nanoparticles thus obtained, the flux component having the above-mentioned characteristics, and optionally the dispersant are added to the above-mentioned dispersion medium. Then, the resultant mixture is introduced into a blending and degassing machine to produce a blended object of the above components. Thereafter, optionally a mechanical dispersion treatment is carried out to form a paste.

For the above mechanical dispersion treatment, any well-known methods can be adopted with the proviso that remarkable reformation of the silver nanoparticle is not caused. Specifically, ultrasonic dispersion, Disper, a three roll mill, a ball mill, a bead mill, a double screw kneader, a rotation/revolution mixer, and others can be illustrated, and they can be used alone or a plurality of them can be also used in combination.

<Formation of Bonded Article>

To form a bonding part, the bonding material is applied to the bonding surface of the bonding object at a thickness of about 20 to 200 μm by, for example, a metal mask stencil, a dispenser, or a screen printing method. Subsequently, the object to be bonded is attached thereto and a bonding material is metalized by a heat-treatment. This bonding material can be metalized even with a heat-treatment in nitrogen, but can be also metalized even with a heat-treatment in the air.

When the bonding material according to the present invention is used at this time, the bonded article can be formed without pressurizing the bonding object and the object to be bonded. However, a pressurizing step is not to be excluded. Addition of the step of pressurizing the bonding object and the object to be bonded may be preferred since stronger bonding can be achieved.

Originally, pressurization has been supposed to be preferable from a viewpoint of reduced fluctuations or improved bonding strength since air bubbles come out of the bonding section by subjecting the bonding section to high pressure. However, when the paste of the present invention is used, pressurization is not necessarily required. Even when the bonding section is pressurized if necessary, sufficiently high bonding strength can be achieved by pressurization of about 5 MPa.

<Pre-Firing Step>

When pressurizing is carried out using the paste (bonding material) according to the present invention to form the bonded article, metallization is preferably carried out by a multiplex heat treatment. Specifically, the metallization goes through the following steps. A firing in the first stage (pre-firing step) aims at evaporating the solvent added to the bonding material. However, with a heat treatment at a too high temperature, not only the solvent but also the organic matter constituting the surface of the silver nanoparticles may be removed. That case is not preferable because the bonding strength is decreased or the fluctuations in quality are caused. Specifically, it is recommended to carry out the heat treatment below the decomposition temperature of the silver nanoparticles.

Since the decomposition temperature of the silver nanoparticles may significantly change with the organic matter coating the surface of the silver nanoparticles, the dispersion medium, or an additive, it is preferable to understand the thermal characteristics of the bonding material with a TG measurement or the like in advance. Generally, the temperature to be set as a pre-firing temperature is preferably set to a temperature lower than the temperature set as a main-firing by about 50° C. to 400° C. The time to spend on the pre-firing depends on a bonding target area, but is sufficient with about 10 minutes and may be about 30 seconds of heating in some cases.

<Main-Firing Step>

After the pre-firing in the case of carrying out the pre-firing, or just after application in the case without the pre-firing, the paste is completely metalized by a main-firing step. A temperature rising step may be provided before the main-firing step. It is preferable that the temperature rising is rate at this time be in the range of 0.5 to 10° C./second, and preferably 0.5 to 5° C./second.

The main-firing is hold at a temperature of 150° C. or higher and 500° C. or lower for a time within 60 minutes or within 30 minutes. In the case of the treatment with applying a pressure to the bonded article from the outside, the pressure to be applied may be 10 MPa or lower and is sufficient with 5 MPa or lower in some cases.

Then, the bonded article thus obtained can acquire remarkable growth of a crystal even under an inert atmosphere. When quantified specifically, the crystallite diameter in an Ag (111) surface calculated by a half width of an X-ray shows 65 nm or larger even with the heat treatment at 250° C. for 10 minutes. As this value is larger, it is preferable since no grain boundary between particles is indicated. It is recommended to have a characteristic of the crystallite diameter of more preferably 67 nm or more, still more preferably 70 nm or more.

EXAMPLES

Example 1

In a 500 mL beaker, 13.4 g of silver nitrate (produced by TOYO KAGAKU Co., Ltd.) was dissolved in 72.1 g of pure water to produce a silver solution.

Subsequently, 1.34 L of pure water was poured into a 5 L beaker, and the temperature was raised up to 60° C. while removing dissolved oxygen by bubbling nitrogen for 30 minutes. Then, 17.9 g of sorbic acid (produced by Wako Pure Chemical Industries, Ltd.) was added thereto. Next, 2.82 g of 28% aqueous ammonia (produced by Wako Pure Chemical Industries, Ltd.) was added for pH adjustment. In both Examples and Comparative Examples as described below, addition of this aqueous ammonia initiates a reaction. With stirring this, 5.96 g of hydrous hydrazine (80% purity, produced by Otsuka Chemical Co., Ltd.) was added in five minutes after the reaction was initiated.

The silver solution was added to be reacted in nine minutes after the reaction was initiated. Subsequently, the mixture was aged for 30 minutes to form the silver nanoparticles coated with sorbic acid. Thereafter, the resultant solution was filtered through a No. 5C filter paper and washed with pure water to obtain a silver nanoparticle aggregate. The aggregate was dried under the conditions of 80° C. for 12 hours in a vacuum dryer to obtain an aggregate of silver nanoparticle dry powder.

45.0 g of the dry powder of the sorbic acid coated silver nanoparticle aggregate (average particle diameter: 60 nm) obtained by the above-mentioned method, 45.0 g of the spherical silver particle powder (D2-1-C spherical silver powder produced by DOWA Electronics Materials Co., Ltd.: average particle diameter ($D_{50}$) of 600 nm) as submicron silver particles, 9.0 g of octanediol (produced by Kyowa Hakko Chemical Co., Ltd.: 2-ethyl-1,3-hexanediol), and 1.00 g (1.0% with respect to the total paste weight) of BEAULIGHT LCA-25NH (produced by Sanyo Chemical Industries, Ltd.) as a humid dispersant were mixed. The mixture was blended with a blending and degassing machine (V-mini 300 model, produced by EME CORPORATION) for 30 seconds (blending conditions/Revolution; 1400 rpm, Rotation; 700 rpm) and subsequently processed through a three roll mill (22851 Norderstedt model, produced by EXAKT Apparatebaus) five times to produce a bonding material paste.

The obtained bonding material was applied on a substrate by a printing method. As the conditions at this time, the metal mask stencil was set to have a thickness of 50 μm and the pattern was set to have a square 2 mm on a side and a thickness of 50 μm, and the bonding material was applied on a silver-plated copper substrate by manual printing with a metal squeegee. The boiling point of octanediol is 244° C. and the flash point is 135° C. Further, even when the paste according to this Example was allowed to stand under the sealed condition at a normal temperature for 90 days, separation of the paste and extreme rise of the viscosity were not caused, thereby showing that the paste was satisfactory for use.

A chip (copper substrate having a square 2 mm on a side and a thickness of 2 mm) was mounted to the above application surface. The mounted article thus obtained was heated at 100° C. for 10 minutes in a nitrogen atmosphere (oxygen concentration: 50 ppm or less) with a furnace (table type lamp heating device MILA-5000 model produced by ULVAC-RIKO, Inc.) to remove the solvent (dispersion medium) component in the paste (pre-firing). In order to confirm the specific resistance and the sintering condition of the fired film, the sample in which the chip was not mounted on the bonding material and only the bonding material was printed on the substrate and fired was also produced at the same time.

The temperature of the pre-fired sample was subsequently raised to 350° C. under the condition of a temperature rising rate of 1° C./second and subjected to a heat-treatment for 5 minutes after reaching 350° C., thereby providing the bonded article (main-firing). In this Example, pressurizing was not performed in both the pre-firing step and the main-firing step.

The bonding strength of the obtained bonded article was confirmed. Specifically, it was carried out according to the method described in "Test Method for Lead-Free Solder, Part 5: Method for Tensile and Shear Test on Solder Joint" in JISZ-03918-5: 2003. Briefly, it is the method for measuring a force when the article to be bonded (chip) bonded on the substrate was pushed horizontally and the bonding surface thereof was broken under the pushed force. In this Example, the test was carried out using Bondtester (4000 Series) produced by Dage Japan Co., Ltd. with a shear height of 150 μm and a testing rate of 5 mm/min at room temperature in measuring. The specific resistance of the fired film was measured by the four probe method.

As a result, the average shear strength was 34.7 MPa, and the CV value (standard deviation/mean×100) indicating bonding fluctuations was 14.1% between 5 samples of Example 1. In the method of the shear test, a force (N) when the bonding surface was broken was measured directly, which is the value dependent on a bonding area. In order to make it the value of standard, the value (MPa) of dividing the force measured when broken by the bonding area (in this case, 2 (mm)×2 (mm)=4 mm²) was as defined as a shear strength. The same applies to the following samples.

Example 2

The procedure of Example 1 was repeated with the constitution of the paste according to Example 1 except that 45.0 g of the dry powder of the sorbic acid coated silver nanoparticle aggregate (average particle diameter: 60 nm), 45.0 g of the spherical silver particle powder (D2-1-C spherical silver powder produced by DOWA Electronics Materials Co., Ltd.: average particle diameter ($D_{50}$) of 600 nm) as submicron silver particles, 8.9 g of octanediol (produced by Kyowa Hakko Chemical Co., Ltd.), 0.10 g of oxydi(acetic acid) (0.1% with respect to the total paste weight), and 1.00 g (1.0% with respect to the total paste weight) of BEAULIGHT LCA-25NH (produced by Sanyo Chemical Industries, Ltd.) as a humid dispersant were mixed. The average shear strength was 47.1 MPa and the CV value indicating bonding fluctuations was 7.8% between five samples, thereby providing the bonded article having high bonding strength and low fluctuations as compared with Example 1. Further, even when the paste according to this Example was allowed to stand under the sealed condition at a normal temperature for 90 days, separation of the paste and extreme rise of the viscosity were not caused, thereby showing that the paste was satisfactory for use.

Example 3

The procedure of Example 2 was repeated similarly with the constitution of the paste according to Example 2 except for 44.2 g of the dry powder of the sorbic acid coated silver nanoparticle aggregate, 44.2 g of the spherical silver particle powder as submicron silver particles, and 10.5 g of octanediol (produced by Kyowa Hakko Chemical Co., Ltd.). The bonding strength and the CV value indicating fluctuations of the obtained bonded article are shown in Table 1. In Table 1, the materials which were not selected were designated as blanks. Further, even when the paste according to this Example was allowed to stand at a normal temperature under the sealed condition for 90 days, separation of the paste and extreme rise of the viscosity were not caused, thereby showing that the paste was satisfactory for use.

Example 4

The procedure of Example 1 was repeated with the same constituent ratio as the constitution of the paste in Example 1 except that dry powder of the sorbic acid coated silver nanoparticle aggregate has an average particle diameter of 100 nm. The bonding strength and the CV value indicating fluctuations of the obtained bonded article are shown in Table 1. Further, even when the paste according to this Example was allowed to stand under the sealed condition at a normal temperature for 90 days, separation of the paste and extreme rise of the viscosity were not caused, thereby showing that the paste was satisfactory for use.

Example 5

The procedure of Example 4 was repeated with the constitution of the paste in Example 4 except that 9.0 g of octanediol was changed into 8.95 g of octanediol and 0.05 g (0.05% with respect to the total paste weight) of oxydi(acetic acid). The bonding strength and the CV value indicating fluctuations of the obtained bonded article are shown in Table 1. Further, even when the paste according to this Example was allowed to stand under the sealed condition at a normal temperature for 90 days, separation of the paste and extreme rise of the viscosity were not caused, thereby showing that the paste was satisfactory for use.

Example 6

The procedure of Example 4 was repeated similarly with the constitution of the paste according to Example 4 except for 46.0 g of the dry powder of the sorbic acid coated silver nanoparticle aggregate, 46.0 g of the spherical silver particle powder as submicron silver particles, and 7.0 g of octanediol (produced by Kyowa Hakko Chemical Co., Ltd.). The bonding strength and the CV value indicating fluctuations of the obtained bonded article are shown in Table 1. Further, even when the paste according to this Example was allowed to stand under the sealed condition at a normal temperature for 90 days, separation of the paste and extreme rise of the viscosity were not caused, thereby showing that the paste was satisfactory for use.

Example 7

The procedure of Example 4 was repeated with the constitution of the paste according to Example 4 except for 43.0 g of the dry powder of the sorbic acid coated silver nanoparticle aggregate, 43.0 g of the spherical silver particle powder as metal micron powder, 12.9 g of octanediol (produced by Kyowa Hakko Chemical Co., Ltd.), and 0.10 g (0.10% with respect to the total paste weight) of oxydi(acetic acid). The bonding strength and the CV value indicating fluctuations of the obtained bonded article are shown in Table 1. Further, even when the paste according to this Example was allowed to stand under the sealed condition at a normal temperature for 90 days, separation of the paste and extreme rise of the viscosity were not caused, thereby showing that the paste was satisfactory for use.

Example 8

The procedure of Example 4 was repeated with the constitution of the paste according to Example 4 except for 44.2 g of the dry powder of the sorbic acid coated silver nanoparticle aggregate, 44.2 g of the spherical silver particle as submicron silver particles, 10.5 g of octanediol (produced by Kyowa Hakko Chemical Co., Ltd.), and 0.10 g (0.10% with respect to the total paste weight) of oxydi(acetic acid). The bonding strength and the CV value indicating fluctuations of the obtained bonded article are shown in Table 1. In the case of heating at a temperature of 260° C. for 10 minutes in the main-firing, the bonding strength of 22.1 MPa and the CV value of 22.4% were obtained as a result. Further, even when the paste according to this Example was allowed to stand under the sealed condition at a normal temperature for 90 days, separation of the paste and extreme rise of the viscosity were not caused, thereby showing that the paste was satisfactory for use.

Comparative Example 1

The procedure of Example 1 was repeated with the constitution of the paste according to Example 1 except for 45.0 g of the dry powder of the sorbic acid coated silver nanoparticle aggregate (average particle diameter: 60 nm), 45.0 g of the spherical silver particle powder (D2-1-C spherical silver powder produced by DOWA Electronics Materials Co., Ltd.: average particle diameter ($D_{50}$) of 600 nm) as submicron silver particles, and 9.00 g of terpineol (mixture of structural isomers/produced by Wako Pure Chemical Industries, Ltd.). The average shear strength was 25.5 MPa and the CV value indicating bonding fluctuations was 30.6% between five samples, thereby providing the bonded article having low bonding strength and large fluctuations as compared with Example 1. The boiling point of terpineol is 219° C. and the flash point is 91° C.

Comparative Example 2

The procedure of Comparative Example 1 was repeated except that 9.00 g of terpineol (mixture of structural isomers/produced by Wako Pure Chemical Industries, Ltd.) of Comparative Example 1 was changed to 8.80 g of terpineol (mixture of structural isomers/produced by Wako Pure Chemical Industries, Ltd.) and 0.20 g (0.2% with respect to the total paste weight) of oxydi(acetic acid). The bonding strength and the CV value indicating fluctuations of the obtained bonded article are shown in Table 1.

Comparative Example 3

The procedure of Comparative Example 1 was repeated except that 9.00 g of terpineol (mixture of structural isomers/produced by Wako Pure Chemical Industries, Ltd.) of Comparative Example 1 was changed to 8.90 g of terpineol (mixture of structural isomers/produced by Wako Pure Chemical Industries, Ltd.) and 0.10 g (0.1% with respect to the total paste weight) of oxydi(acetic acid). The bonding strength and the CV value indicating fluctuations of the obtained bonded article are shown in Table 1.

Comparative Example 4

The procedure of Example 4 was repeated except that octanediol of Example 4 was changed to terpineol (mixture of structural isomers/produced by Wako Pure Chemical Industries, Ltd.). The bonding strength and the CV value indicating fluctuations of the obtained bonded article are shown in Table 1.

parative Examples are large after the point of the CV value of about 12%. Each sample of Examples showed high bonding strength at that time.

The comparison of Comparative Example 1 and Comparative Example 4 shows the effect due to the difference in the particle diameter of the silver nanoparticles (changed from 60 to 100 nm). Thus, the bonded article having slightly improved bonding strength and reduced strength fluctuations between bonding samples was obtained. The comparison of Comparative Example 4 and Example 4 shows the effect caused by changing the solvent. The bonded article having equivalent strength fluctuations between bonding samples but significantly improved bonding strength was obtained. Further, the comparison between Examples 4 and 5 shows that the bonded article having high bonding strength and reduced fluctuations was obtained when part of octanediol was replaced by oxydi(acetic acid).

Therefore, it was found that, when the paste according to Example was used, the bonded article having high bonding strength of 30 MPa or more and fluctuations in bonding strength of less than 20% was obtained in spite of firing in nitrogen. This significantly contributes to improvement in product stability.

TABLE 1

| | SILVER POWDER | | SOLVENT | | | | | |
|---|---|---|---|---|---|---|---|---|
| | SORBIC ACID COATED SILVER NANO-PARTICLES (g) | | MICRON POWDER | TERPINEOL (g): BOILING POINT | OCTANEDIOL (g): BOILING POINT | OXYDI (ACETIC ACID) | DISPERSANT | BONDING STRENGTH | |
| | 60 nm | 100 nm | (g) | OF 219° C. | OF 224° C. | (g) | (g) | (MPa) | CV (%) |
| EXAMPLE 1 | 45.0 | | 45.0 | | 9.00 | | 1.00 | 34.7 | 14.1 |
| EXAMPLE 2 | 45.0 | | 45.0 | | 8.90 | 0.10 | 1.00 | 47.1 | 7.8 |
| EXAMPLE 3 | 44.2 | | 44.2 | | 10.50 | 0.10 | 1.00 | 42.0 | 9.9 |
| EXAMPLE 4 | | 45.0 | 45.0 | | 9.00 | | 1.00 | 44.9 | 12.5 |
| EXAMPLE 5 | | 45.0 | 45.0 | | 8.95 | 0.05 | 1.00 | 50.0 | 6.3 |
| EXAMPLE 6 | | 46.0 | 46.0 | | 7.00 | | 1.00 | 49.6 | 10.5 |
| EXAMPLE 7 | | 43.0 | 43.0 | | 12.90 | 0.10 | 1.00 | 33.1 | 5.3 |
| EXAMPLE 8 | | 44.2 | 44.2 | | 10.50 | 0.10 | 1.00 | 42.7 | 8.1 |
| COMPARATIVE EXAMPLE 1 | 45.0 | | 45.0 | 9.00 | | | 1.00 | 25.5 | 30.6 |
| COMPARATIVE EXAMPLE 2 | 45.0 | | 45.0 | 8.80 | | 0.20 | 1.00 | 24.7 | 24.4 |
| COMPARATIVE EXAMPLE 3 | 45.0 | | 45.0 | 8.90 | | 0.10 | 1.00 | 31.4 | 31.0 |
| COMPARATIVE EXAMPLE 4 | | 45.0 | 45.0 | 9.00 | | | 1.00 | 29.8 | 12.8 |

The comparison between Comparative Example 1 and Example 1 shows the effect caused by changing the solvent from terpineol (boiling point of 219° C.) to octanediol (boiling point of 244° C.). As obvious therefrom, the bonded article having high bonding strength and reduced strength fluctuations between bonding samples was obtained. Further, the comparison between Examples 1 and 2 shows that the bonded article having high bonding strength and reduced fluctuations can be obtained when part of octanediol is replaced by oxydi(acetic acid).

Figure 1:
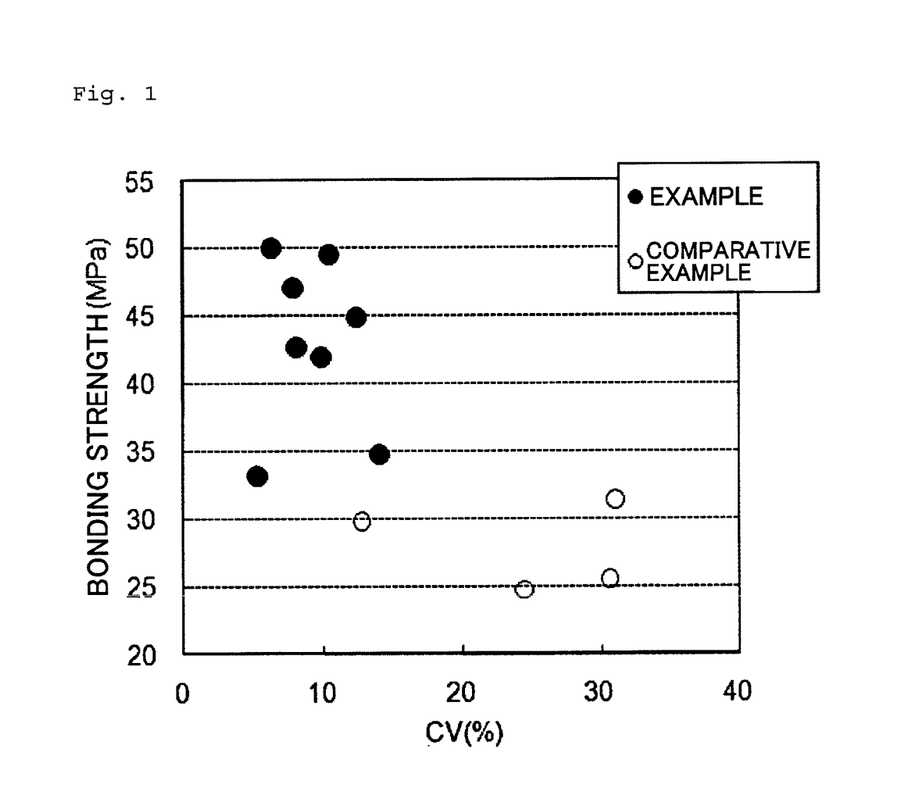
FIG. 1 shows the bonding strength (MPa) and the CV value (%) of fluctuations between samples according to Examples and Comparative Examples.

FIG. 1 is a graph showing the relationship between the bonding strength (MPa) and the fluctuations (CV value (%)). The vertical axis represents the bonding strength (MPa) and the horizontal axis represents the CV value (%). Overall, the smaller the CV value, the larger the bonding strength, showing the tendency being larger at the left side. In addition, the CV values of Examples are small and the CV values of Com- Moreover, the viscosity was measured to be 71.5 MPa in Example 5 and 28.5 MPa in Example 7, thereby showing that the paste having proper viscosity can be provided depending on the constitution of metal. This shows that the paste having the viscosity corresponding to each printing method and printing conditions can be provided, and it is expected that the paste can be applied to bonding for any applications.

Figure 2:
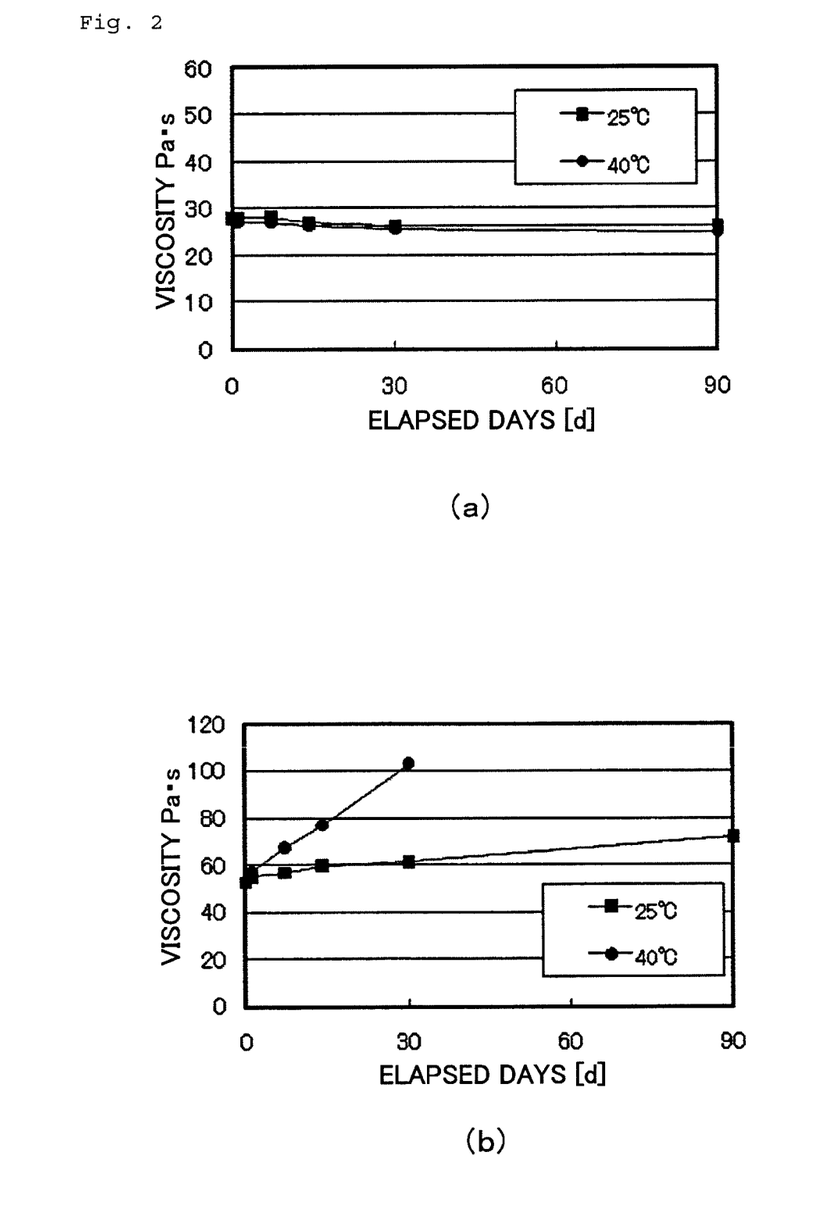
FIG. 2 shows the preservation stability of Example and Comparative Example.

FIG. 2 shows the preservation stability of Example and Comparative Example. FIG. 2A shows the preservation stability of Example 7, and FIG. 2B shows the preservation stability of Comparative Example 2. The horizontal axis represents the lapsed days and the vertical axis represents the viscosity, respectively. They are the results of the case where 100 g of each bonding material was enclosed in a glass vial which can be capped, capped and preserved under the environments of normal temperature (25° C.) and high temperature (40° C.)

for each sample. The glass vial was sealed with a cap to the extent equivalent to the packing condition in generally marketed.

Further, the viscosity is the value obtained by using a rheometer (HAKKE RheoStress 600) with a cone having φ35 mm and 2° angle under the conditions of a gap of 0.105 mm and a temperature of 25° C. at a shear rate of 3.13 [1/s] in measuring.

In the case of Example 7 (FIG. 2A), there is little change in viscosity even after 90 days. However, in the case of the Comparative Example (FIG. 2B), the viscosity had largely changed for 90 days. The boiling point of terpineol is 219° C., which is lower as compared with the boiling point of 244° C. of octanediol, but it is a sufficiently high temperature as compared with the environmental temperature. However, a large change in viscosity was observed in the long-term preservation. The viscosity increased not simply because terpineol came out of a preservation container, and this indicates that octanediol is a material giving the stability to the composition system of the bonding material according to the present invention.

INDUSTRIAL APPLICABILITY

As described above, the bonding according to the present invention can be also applied to non-insulated semiconductor devices, the assembly technology for mounting bare chips, and the bonding step in manufacturing power devices (IGBT, rectifier diode, power transistor, power MOSFET, insulated gate bipolar transistor, thyristor, gate turn-off thyristor, and triac. Further, it can be also used as a bonding material onto a glass having the surface treated with chrome, and can be also used as a bonding material for an electrode or a frame of a lighting system using LED.

The invention claimed is:

1. A bonding material, comprising silver nanoparticles having an average primary particle diameter of 1 to 200 nm coated with an organic substance having 8 carbon atoms or less, a dispersion medium having a boiling point of 230° C. or higher, and submicron silver particles having an average particle diameter of 0.5 to 3.0 μm.

2. The bonding material according to claim 1, wherein the dispersion medium having a boiling point of 230° C. or higher is octanediol.

3. A bonding material, comprising silver particles having an average primary particle diameter of 1 to 200 nm coated with an organic substance having 8 carbon atoms or less, a dispersion medium having a boiling point of 230° C. or higher, and an organic matter having at least two carboxyl groups as a flux component.

4. The bonding material according to claim 3, wherein the organic matter having at least two carboxyl groups further has an ether bond.

5. The bonding material according to claim 3, wherein the organic matter having at least two carboxyl groups is oxydi (acetic acid).

6. A method for bonding two different substances, comprising the steps of: applying to a bonding surface a bonding material including silver nanoparticles having at least an average primary particle diameter of 1 to 200 nm and coated with an organic substance having 8 carbon atoms or less, an organic matter having at least two carboxyl groups and at least one ether bond as a flux component, and a dispersion medium having a boiling point of 230° C. or higher (applying step); placing an object to be bonded on the bonding material; pre-firing for heating to a predetermined temperature with the object to be bonded being placed; and main-firing for heating to a temperature higher than the temperature of the pre-firing.

7. The bonding method according to claim 6, wherein the steps of the pre-firing and the main-firing are carried out under an inert gas atmosphere.

8. The bonding method according to claim 6, wherein the step of the main-firing is carried out at temperatures of 200° C. or higher and 500° C. or lower.

* * * * *